United States Patent
Jeong et al.

(10) Patent No.: US 10,600,358 B2
(45) Date of Patent: Mar. 24, 2020

(54) ORGANIC LIGHT-EMITTING DISPLAY DEVICE

(71) Applicant: LG Display Co., Ltd., Seoul (KR)

(72) Inventors: Ho-Young Jeong, Goyang-si (KR); Tae-Han Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 134 days.

(21) Appl. No.: 15/837,303

(22) Filed: Dec. 11, 2017

(65) Prior Publication Data

US 2018/0174508 A1 Jun. 21, 2018

(30) Foreign Application Priority Data

Dec. 16, 2016 (KR) .................. 10-2016-0172770

(51) Int. Cl.
*G09G 3/3208* (2016.01)
*H01L 27/32* (2006.01)
*H01L 51/52* (2006.01)
*H01L 51/00* (2006.01)

(52) U.S. Cl.
CPC ....... *G09G 3/3208* (2013.01); *H01L 27/3209* (2013.01); *H01L 27/3213* (2013.01); *H01L 51/0096* (2013.01); *H01L 51/5218* (2013.01); *H01L 51/5271* (2013.01); *G09G 2300/023* (2013.01); *G09G 2300/0426* (2013.01); *G09G 2300/0452* (2013.01); *H01L 27/322* (2013.01); *H01L 27/3244* (2013.01); *H01L 51/5206* (2013.01); *H01L 51/5221* (2013.01); *H01L 51/5278* (2013.01)

(58) Field of Classification Search
CPC .............. G09G 3/3208; H01L 27/3209; H01L 27/3213; H01L 51/0096; H01L 51/5218; H01L 51/5271
See application file for complete search history.

(56) References Cited

U.S. PATENT DOCUMENTS

| | | | |
|---|---|---|---|
| 6,756,732 B1 * | 6/2004 | Kawase ............... | G02B 5/0841 313/110 |
| 2006/0175961 A1 * | 8/2006 | Choong .............. | H01L 51/5265 313/506 |
| 2010/0123150 A1 * | 5/2010 | Anandan ............ | H01L 27/3209 257/98 |
| 2018/0183007 A1 * | 6/2018 | Magno ................... | C30B 29/54 |

* cited by examiner

*Primary Examiner* — Ariel A Balaoing
(74) *Attorney, Agent, or Firm* — Morgan, Lewis & Bockius LLP

(57) ABSTRACT

An organic light-emitting display device includes: a substrate, light-emitting elements on the substrate, and a light control layer structure between an anode of each of the light-emitting elements and the substrate, the light control layer structure including at least one pair of an alternately stacked low refractive index layer and high refractive index layer, a lowest high refractive index layer contacting an upper surface of the substrate.

15 Claims, 7 Drawing Sheets

ORGANIC LIGHT-EMITTING DISPLAY DEVICE

CROSS-REFERENCE TO RELATED APPLICATION(S)

This application claims the priority of Korean Application No. 10-2016-0172770, filed on Dec. 16, 2016, the entirety of which is hereby incorporated by reference.

BACKGROUND

1. Technical Field

The present disclosure relates to an organic light-emitting display device, and more particularly, to an organic light-emitting display device having improved efficiency.

2. Discussion of the Related Art

As we have recently entered the information age, the field of displays that visually display electrical information signals has been rapidly developed. To satisfy such development, various flat display devices having excellent performance, such as thinness, light weight, and low power consumption, are now being vigorously developed. As examples of flat display devices, there are a liquid crystal display (LCD), a plasma display panel (PDP), a field emission display (FED), an organic light-emitting display, etc.

Particularly, an organic light-emitting display is a self-luminous display and has advantages as compared with other flat displays, such as high response speed, high luminous efficacy, high brightness, and wide viewing angle. Such an organic light-emitting display includes an anode, a hole injection layer, a hole transport layer, a light-emitting layer, an electron transport layer, an electron injection layer, and a cathode.

In the organic light-emitting display, light generated by the light-emitting layer exits through a substrate. Thus, an image is displayed. However, light generated by the light-emitting layer is reflected at an interface between the anode and the substrate toward the cathode due to a refractive index difference therebetween. Thus, efficiency may be lowered.

SUMMARY

Accordingly, the present disclosure is directed to an organic light-emitting display device that substantially obviates one or more of the problems due to limitations and disadvantages of the related art.

An aspect of the present disclosure is to provide an organic light-emitting display device having improved efficiency.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an organic light-emitting display device, including: a substrate, light-emitting elements on the substrate, and a light control layer structure between an anode of each of the light-emitting elements and the substrate, the light control layer structure including at least one pair of an alternately stacked low refractive index layer and high refractive index layer, a lowest high refractive index layer contacting an upper surface of the substrate.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that are included to provide a further understanding of the disclosure and are incorporated in and constitute a part of this application, illustrate embodiments of the disclosure and together with the description serve to explain various principles of the disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of that may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Figure 1:
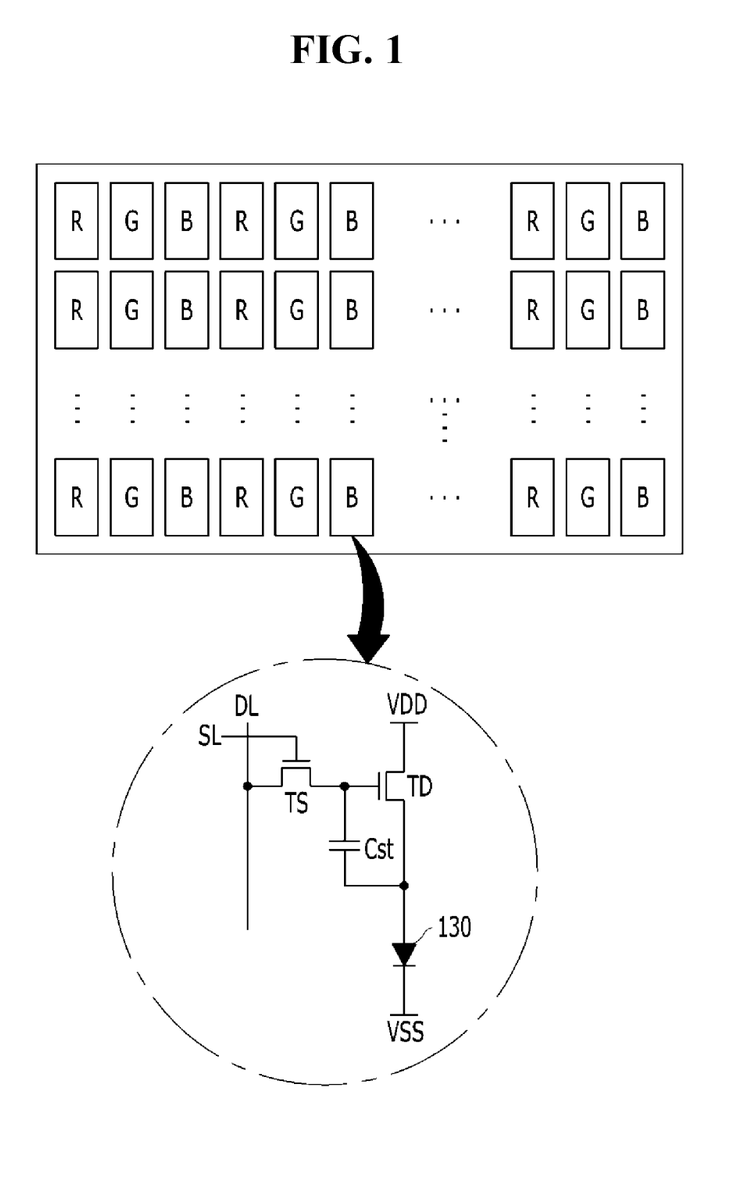
FIG. 1 is a plan view of an organic light-emitting display device in accordance with an embodiment of the present disclosure.
Figure 2:
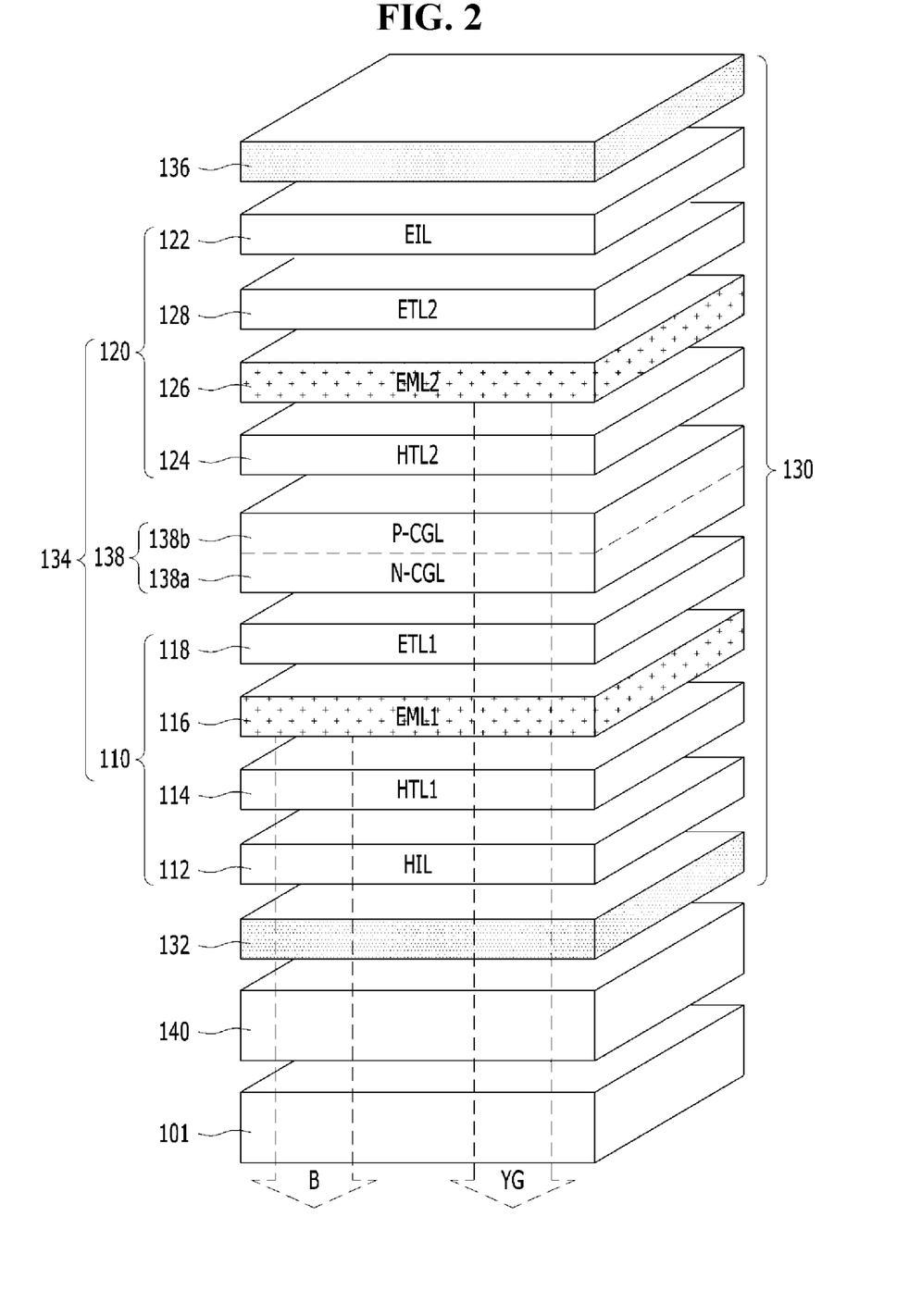
FIG. 2 is a cross-sectional view illustrating a light-emitting element shown in FIG. 1 in detail.
Figure 3:
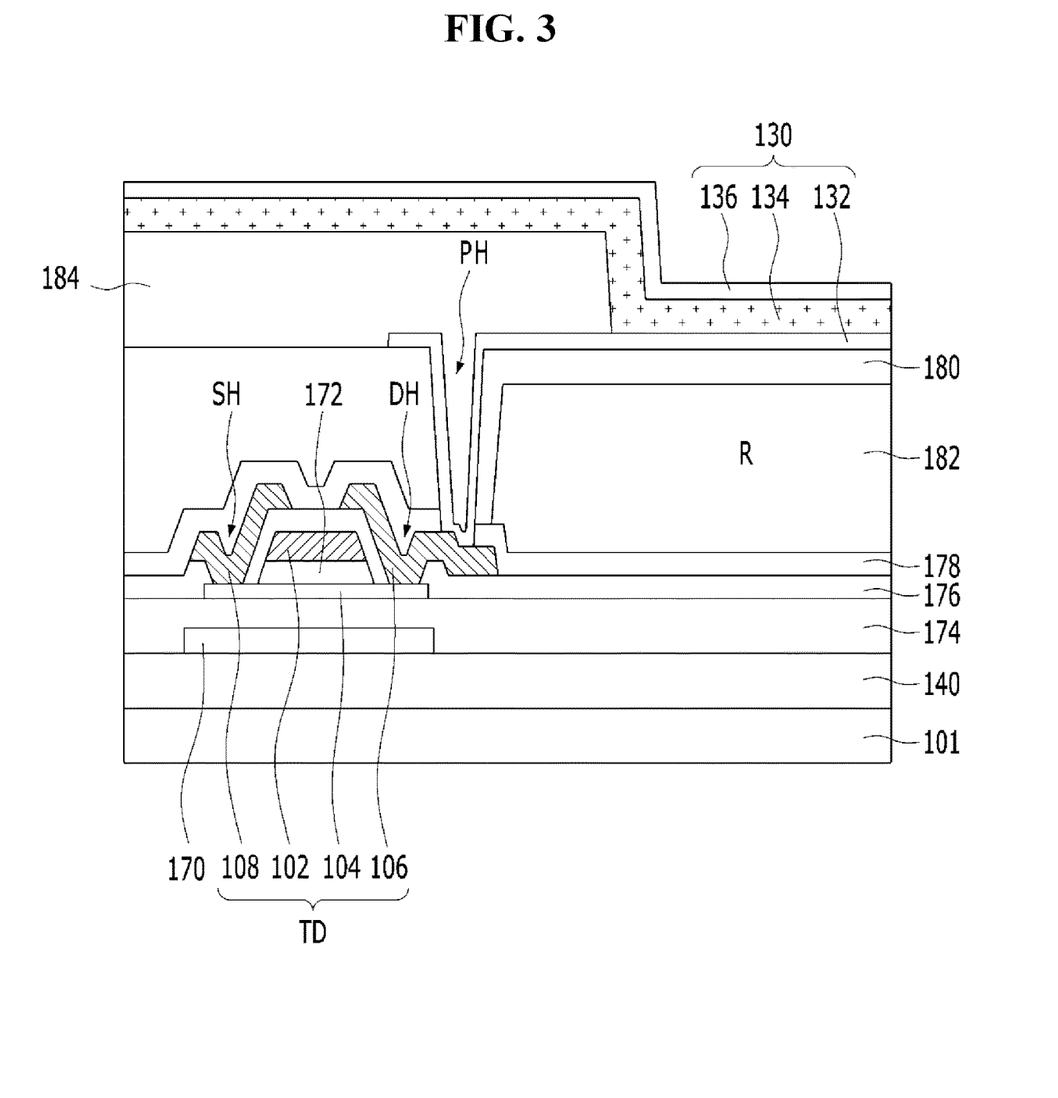
FIG. 3 is a cross-sectional view illustrating a driving thin film transistor connected to the light-emitting element shown in FIG. 2 in detail.
Figure 4:
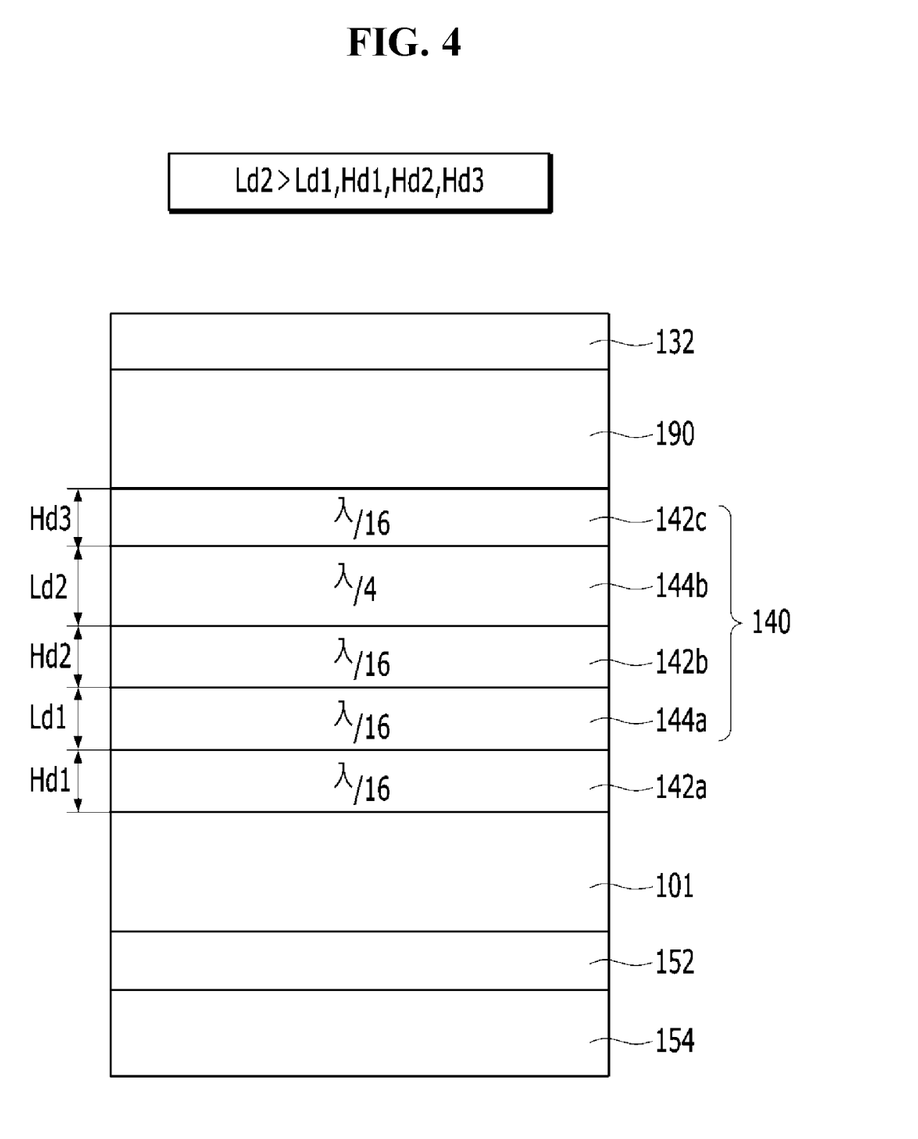
FIG. 4 is a cross-sectional view illustrating an example of a light control layer structure shown in FIG. 2.

FIG. 1 is a plan view of an organic light-emitting display device in accordance with an embodiment of the present disclosure. FIG. 2 is a cross-sectional view illustrating a light-emitting element shown in FIG. 1 in detail. FIG. 3 is a cross-sectional view illustrating a driving thin film transistor connected to the light-emitting element shown in FIG. 2 in detail. FIG. 4 is a cross-sectional view illustrating an example of a light control layer structure shown in FIG. 2.

The organic light-emitting display device shown in the FIG. 1 example may display an image through unit pixels including light-emitting elements 130. The unit pixels may include red (R), green (G), and blue (B) sub-pixels, or may include red (R), green (G), blue (B), and white (W) sub-pixels. Each sub-pixel may include the light-emitting element 130 and a pixel driving circuit to independently drive the light-emitting element 130.

The light-emitting element 130 may include an anode 132 and a cathode 136 opposite each other, and a light-emitting stack 134 disposed between the anode 132 and the cathode 136, as shown in the FIG. 2 example. At least one of the anode 132 and the cathode 136 may be formed as a transflective electrode. If the anode 132 is a transflective electrode and the cathode 136 is a reflective electrode, the organic light-emitting display device may be a rear emission type light-emitting structure that may emit light through the lower part thereof. If the anode 132 is a reflective electrode and the cathode 136 is a transflective electrode, the organic light-emitting display device may be a front emission type light-emitting structure that may emit light through the upper part thereof. Further, both the anode 132 and the cathode 136 may be formed as transmissive electrodes. Thus, the organic light-emitting display device may have a dual emission-type light-emitting structure that may emit light through the upper and lower parts thereof.

A transflective electrode may use a transparent conductive material, such as indium tin oxide (ITO) and/or indium zinc oxide (IZO), and an opaque conductive material, such as aluminum (Al), gold (Au), molybdenum (Mo), chrome (Cr), copper (Cu), and/or LiF. A reflective electrode may use a reflective metal, such as aluminum (Al), gold (Au), molybdenum (Mo), chrome (Cr), copper (Cu), and/or LiF, or may have a multilayer structure using the same. A transmissive electrode may use a transparent conductive material, such as indium tin oxide (ITO) and/or indium zinc oxide (IZO). Embodiments are not limited to these examples.

In example embodiments of the present disclosure, the anode 132 as a transflective electrode and the cathode 136 as a reflective electrode will be described. The light-emitting stack 134 may include a charge generation layer 138 and first and second light-emitting stacks 110 and 120 opposite each other, with the charge generation layer 138 interposed therebetween. The charge generation layer 138 may include an N-type charge generation layer (N-CGL) 138a and a P-type charge generation layer (P-CGL) 138b, which may be sequentially stacked.

The P-type charge generation layer 138b may be between the N-type charge generation layer 138a and a second hole transport layer 124, and may generate holes and electrons.

Holes generated by the P-type charge generation layer 138b may be injected into the second hole transport layer 124 of the neighboring second light-emitting stack 120. Electrons generated by the P-type charge generation layer 138b may be injected into the N-type charge generation layer 138a. The N-type charge generation layer 138a may be between the P-type charge generation layer 138b and a first electron transport layer 118, and may inject and transport electrons injected from the P-type charge generation layer 138b into the first electron transport layer 118.

The first light-emitting stack 110 may be between the anode 132 and the N-type charge generation layer 138a. The first light-emitting stack 110 may include a hole injection layer (HIL) 112, at least one first hole transport layer (HTL1) 114, a first light-emitting layer (EML1) 116, and a first electron transport layer (ETL1) 118, which may be sequentially formed on the anode 132. The first hole transport layer 114 may supply holes from the anode 132 to the first light-emitting layer 116, and the first electron transport layer 118 may supply electrons from the N-type charge generation layer 138a to the first light-emitting layer 116. In the first light-emitting layer 116, the holes supplied through the first hole transport layer 114 and the electrons supplied through the first electron transport layer 118 may recombine with each other to generate light.

The second light-emitting stack 120 may be between the cathode 136 and the P-type charge generation layer 138b. The second light-emitting stack 120 may include a second hole transport layer (HTL2) 124, a second light-emitting layer (EML2) 126, a second electron transport layer (ETL2) 128, and an electron injection layer (EIL) 122, which may be sequentially formed on the P-type charge generation layer 138b. The second hole transport layer 124 may supply holes from the P-type charge generation layer 138b to the second light-emitting layer 126, and the second electron transport layer 128 may supply electrons from the cathode 136, injected through the electron injection layer 122, to the second light-emitting layer 126. In the second light-emitting layer 126, the holes supplied through the second hole transport layer 124 and the electrons supplied through the second electron transport layer 128 may recombine with each other to generate light.

For example, the first light-emitting layer 116 may include a blue fluorescent or phosphorescent dopant and a host, and may thus emit blue light, and the second light-emitting layer 126 may include a yellowish-green fluorescent or phosphorescent dopant and a host, and may thus emit yellowish-green light, thereby generating white light. In addition, white light may be generated using other fluorescent or phosphorescent dopants.

A color filter 182 may be disposed on a protective film 178 to overlap an emission area prepared by a bank 184, as shown in the FIG. 3 example. Any one of red (R), green (G), and blue (B) color filters 182 may be disposed in each sub-pixel. That is, a red (R) color filter 182 may be disposed in a red (R) sub-pixel, a green (G) color filter 182 may be disposed in a green (G) sub-pixel, and a blue (B) color filter 182 may be disposed in a blue (B) sub-pixel. Therefore, white light generated by the light-emitting stack 134 may pass through the color filter 182. Thus, light of a color corresponding to the color filter 182 may be produced. Further, the color filter 182 may extend to cover at least one of switching and driving thin film transistors TS and TD.

As such, if the light-emitting stack 134 generates white light, white light generated by the light-emitting stack 134 may be incident upon the color filter 182, thus implementing a color image. On the other hand, each light-emitting stack 134 may generate light of a color corresponding to each sub-pixel without the color filter 182. Thus, a color image may be implemented. That is, the light-emitting stack 134 of a red sub-pixel may generate red light, the light-emitting stack 134 of a green sub-pixel may generate green light, and the light-emitting stack 134 of a blue sub-pixel may generate blue light.

The pixel driving circuit may include a switching thin film transistor TS, a driving thin film transistor TD, and a storage capacitor Cst. The switching thin film transistor TS may be turned on when a scan pulse is supplied to a scan line SL, and may supply a data signal supplied to a data line DL to the storage capacitor Cst and a gate electrode of the driving thin film transistor TD.

The driving thin film transistor TD may control a current (I) supplied from a high voltage (VDD) supply line to the light-emitting element 130 in response to the data signal supplied to the gate electrode of the driving thin film transistor TD, thus adjusting an amount of light emitted from the light-emitting element 130. Further, even if the switching thin film transistor TS were to be turned off, the driving thin film transistor TD may supply a constant current (I) due to voltage charged in the storage capacitor Cst until a data signal of a next frame is supplied, and thus may maintain emission of light from the light-emitting element 130. A low voltage (VSS) supply line, which may be low or a ground potential, may also be provided.

As such, the driving thin film transistor TD may include a gate electrode 102, a source electrode 108, a drain electrode 106, and an active layer 104, as shown in the FIG. 3 example. The gate electrode 102 may be formed on a gate insulating pattern 172 having the same shape as the gate electrode 102. The gate electrode 102 may overlap a channel area of the active layer 104 with the gate insulating pattern 172 interposed therebetween. The source electrode 108 may be connected to the active layer 104 exposed through a source contact hole SH formed through an interlayer insulating film 176. The drain electrode 106 may be connected to the active layer 104 exposed through a drain contact hole DH formed through the interlayer insulating film 176. Further, the drain electrode 106 may be exposed through a pixel contact hole PH formed through a protective film 178 and a planarization film 180, and may thus be connected to the anode 132.

Each of the gate electrode 102, the source electrode 108, and the drain electrode 106 may have a single-layer structure including, for example, molybdenum (Mo), aluminum (Al), chrome (Cr), gold (Au), titanium (Ti), nickel (Ni), neodymium (Nd), copper (Cu), and/or an alloy thereof, or may have a multilayer structure including the same, but embodiments are not limited thereto. The active layer 104 may overlap the gate electrode 102 with the gate insulating pattern 172 interposed therebetween, and may thus form a channel between the source and drain electrodes 108 and 106. The active layer 104 may be include at least one of: an amorphous semiconductor material, a polycrystalline semiconductor material, and an oxide semiconductor material.

A buffer film 174, a light shielding layer 170, and a light control layer structure 140 may be formed between the active layer 104 and the substrate 101. The light shielding layer 170 may be on the light control layer structure 140 and may overlap the active layer 104. The light shielding layer 170 may absorb or reflect light incident from the outside, and may thus block external light incident upon the active layer 104. The light shielding layer 170 may be formed of an opaque metal, such as Mo, Ti, Al, Cu, Cr, Co, W, Ta, and/or Ni. The buffer film 174 may reduce or prevent diffusion of moisture or impurities generated from the substrate 101, or may adjust a heat transfer speed during crystallization, thus facilitating crystallization of the active layer 104.

In the organic light-emitting display device, a refractive index layer of a thin film layer, disposed in the path of light generated from the light-emitting element 130 and traveling to the light control layer structure 140, may be formed of a material having similar refractive indexes to low refractive index layers of the light control layer structure 140. That is, the buffer film 174, the interlayer insulating film 176, the protective film 178, the color filter 182, and the planarization film 180, which may be disposed between the anode 132 and the light control layer structure 140, may be formed of materials having similar refractive indexes to the low refractive index layers of the light control layer structure 140.

Further, the light control layer structure 140 may be disposed between the anode 132 and the substrate 101. To reduce a refractive index difference between the anode 132 and substrate 101 having different refractive indexes, the light control layer structure 140 may be formed between the anode 132 and the substrate 101 to have a refractive index between the refractive indexes of the anode 132 and the substrate 101. For example, if the substrate 101 has a refractive index of 1.5 and the anode 132 has a refractive index of 1.8 or more, the light control layer structure 140 may have a refractive index of 1.5~1.8.

For this purpose, the light control layer structure 140 may be formed by alternately stacking low refractive index layers 144a and 144b and high refractive index layers 142a, 142b, and 142c having smaller physical thicknesses than those of the low refractive index layers 144a and 144b. For example, if the lowermost layer 142a of the light control layer structure 140, contacting the upper surface of the substrate 101, has a high refractive index and a thin film layer 190, between the anode 132 and the light control layer structure 140, has a low refractive index, low reflection effects may be acquired. For this purpose, the thin film layer 190, between the anode 132 and the light control layer structure 140, may be formed of a material having a lower refractive index than the high refractive index layers 142a, 142b, and 142c of the light control layer structure 140. That is, the buffer film 174, the interlayer insulating film 176, the protective film 178, the color filter 182, and the planarization film 180, which may be between the anode 132 and the light control layer structure 140, may be formed of materials having similar refractive indexes to the low refractive index layers 144a and 144b of the light control layer structure 140. The light control layer structure 140, in which a first high refractive index layer 142a, a first low refractive index layer 144a, a second high refractive index layer 142b, a second low refractive index layer 144b, and a third high refractive index layer 142c may be sequentially stacked on the substrate 101, will be described by examples.

The first and second low refractive index layers 144a and 144b may be formed of a material having a refractive index n1 which may be greater than or equal to 1.3 and may be less than or equal to 1.6 (e.g., $1.3 \leq n1 \leq 1.6$). For example, the first and second low refractive index layers 144a and 144b may be formed to have a single layer or multilayer structure using at least one of $SiO_2$ (n1=1.4-1.5) and $MgF_3$ (n1=1.3-1.4).

The first to third high refractive index layers 142a, 142b, and 142c may be formed of a material having a refractive index n2 which may be greater than or equal to 1.6 and may be less than or equal to 2.4 (e.g., $1.6 \leq n2 \leq 2.4$). The first to third high refractive index layers 142a, 142b, and 142c may be formed to have a single layer or multilayer structure using at least one of $Si_3N_4$ (n2=1.8-1.9), $TiO_2$ (n2=2.0-2.3), MgO (n2=1.74), $Al_2O_3$ (n2=1.8-1.9), SiO (n2=1.8-1.9), and ZnS (n2=2.3-2.4).

The optical thicknesses of the respective layers of the light control layer structure 140 may be formed to be λ/4i (where "i" is a natural number). For example, the first to third high refractive index layers 142a, 142b, and 142c and the first low refractive index layer 144a may have an optical thickness of λ/16, and the second low refractive index layer 144b may have an optical thickness of λ/4, to control a phase difference of blue light generated by the first light-emitting layer 116, and thus may raise blue light output efficiency. For example, when the wavelength of blue light generated by the first light-emitting layer 116 is 450 nm, the first to third high refractive index layers 142a, 142b, and 142c having an optical thickness of λ/6 may have physical thicknesses Hd1, Hd2, and Hd3 of 14-16 nm, the first low refractive index layer 144a having an optical thickness of λ/16 may be formed to have a first physical thickness Ld1 of 15-19 nm, and the second low refractive index layer 144b having an optical thickness of λ/4 may be formed to have a second physical thickness Ld2 of 65-80 nm, which may be greater than that of at least one of the first to third high refractive index layers 142a, 142b, and 142c and the first low refractive index layer 144a. For example, an optical thickness λ/4i may be equal to a refractive index n multiplied by a physical thickness d. All numerical examples above are nonlimiting.

Figure 5A:
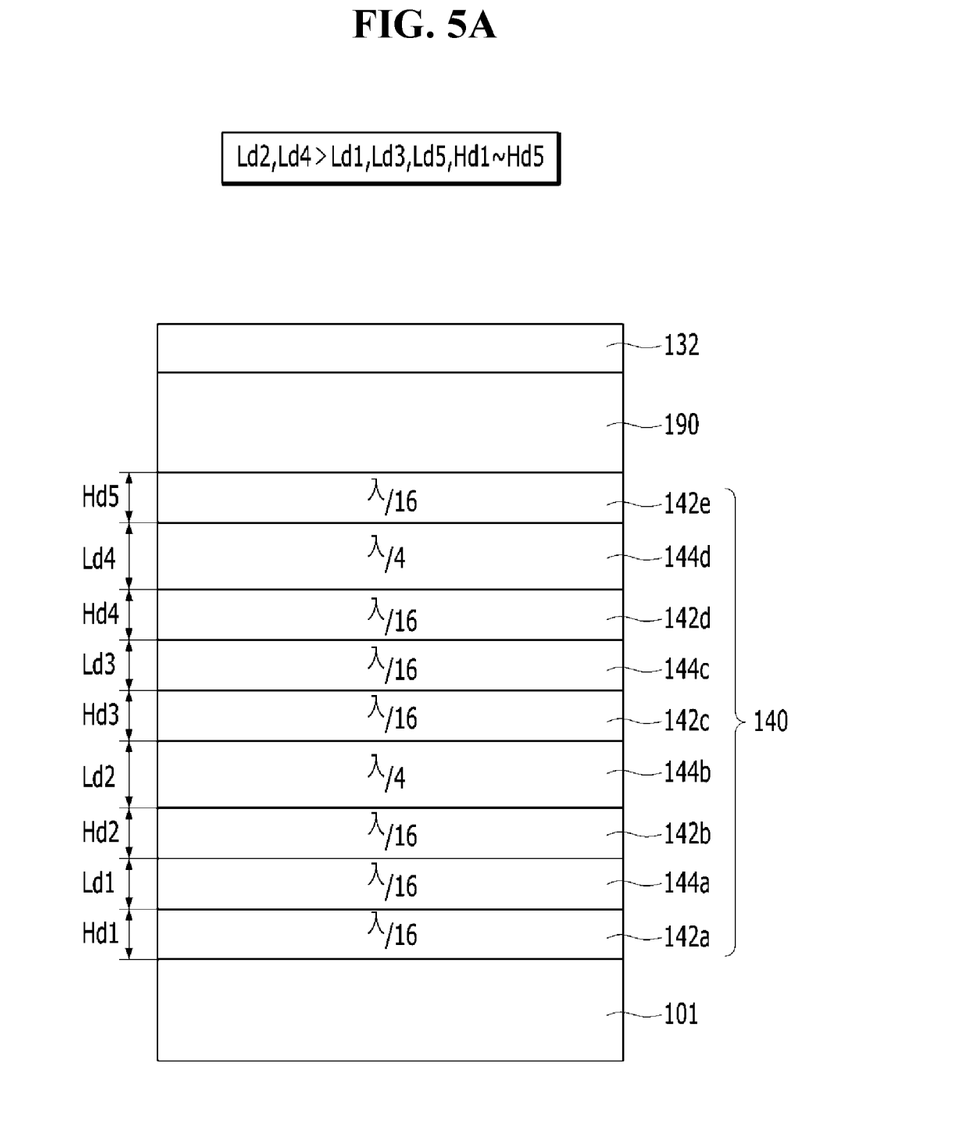
FIGS. 5A and 5B are cross-sectional views of additional examples of the light control layer structure shown in FIG. 2.
Figure 5B:
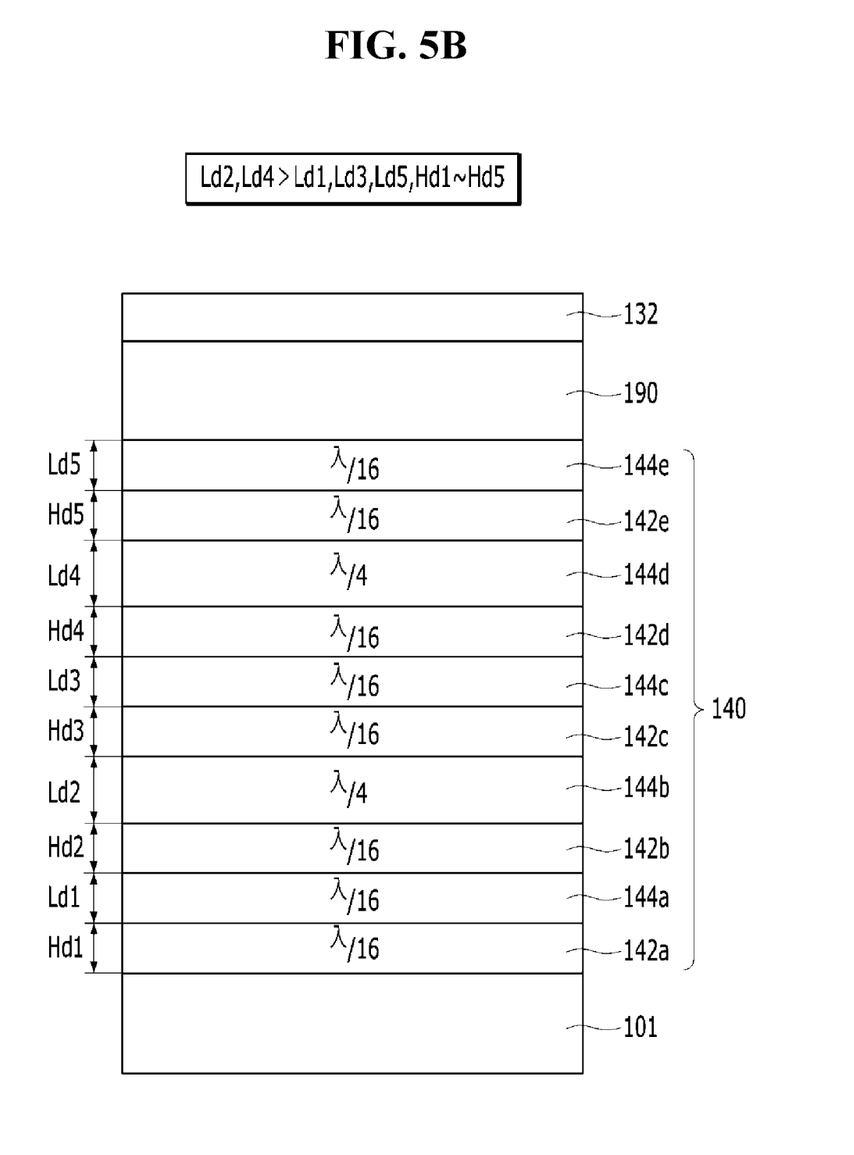

FIGS. 5A and 5B are cross-sectional views of additional examples of the light control layer structure shown in FIG. 2.

The light control layer structure 140 may include six or more layers, as illustrated in the examples of FIGS. 5A and 5B. The light control layer structure 140 shown in the FIG. 5A example may include nine layers, e.g., a first high refractive index layer 142a, a first low refractive index layer 144a, a second high refractive index layer 142b, a second low refractive index layer 144b, a third high refractive index layer 142c, a third low refractive index layer 144c, a fourth high refractive index layer 142d, a fourth low refractive index layer 144d, and a fifth high refractive index layer 142e, which may be sequentially formed on the substrate 101. The light control layer structure 140 shown in the FIG. 5B example may include ten layers, e.g., a first high refractive index layer 142a, a first low refractive index layer 144a, a second high refractive index layer 142b, a second low refractive index layer 144b, a third high refractive index layer 142c, a third low refractive index layer 144c, a fourth high refractive index layer 142d, a fourth low refractive index layer 144d, a fifth high refractive index layer 142e, and a fifth low refractive index layer 144e, which may be sequentially formed on the substrate 101.

For example, the first to fifth high refractive index layers 142a, 142b, 142c, 142d, and 142e and the first, third and fifth low refractive index layer 144a, 144c, and 144e may have an optical thickness of λ/16. The second and fourth low refractive index layers 144b and 144d may have an optical thickness of λ/4. Therefore, when the wavelength of blue light generated by the first light-emitting layer 116 is 450 nm, the first to fifth high refractive index layers 142a, 142b, 142c, 142d, and 142e having an optical thickness of λ/16 may have respective physical thicknesses Hd1, Hd2, Hd3, Hd4, and Hd5 of 14-16 nm, the first, third and fifth low refractive index layers 144a, 144c, and 144e having an optical thickness of λ/16 may have respective physical thicknesses Ld1, Ld3, and Ld5 of 15-19 nm, and the second and fourth low refractive index layers 144b and 144d having an optical thickness of λ/4 may have respective physical thicknesses Ld2 and Ld4 of 65-80 nm. For example, the physical thickness of at least one of the second and fourth low refractive index layers 144b and 144d may be greater than that of at least one of the first to fifth high refractive index layers 142a, 142b, 142c, 142d, and 142e and the first, third and fifth low refractive index layers 144a, 144c, and 144e. All numerical examples above are nonlimiting.

Because light reflected by the upper surface of each of the layers of the light control layer structure 140, and light reflected by the lower surface of each of the layers of the light control layer structure 140, may interfere with each other and may thus be offset, reflection of light at the interface between the anode 132 and the substrate 101 may be reduced or prevented. Therefore, by the light control layer structure 140, light generated by the first and second light-emitting layers 116 and 126 may not be reflected at the interface between the anode 132 and the substrate 101 toward the cathode 136, and may be transmitted by the substrate 101, and luminous efficacy may thus be improved.

Figure 6:
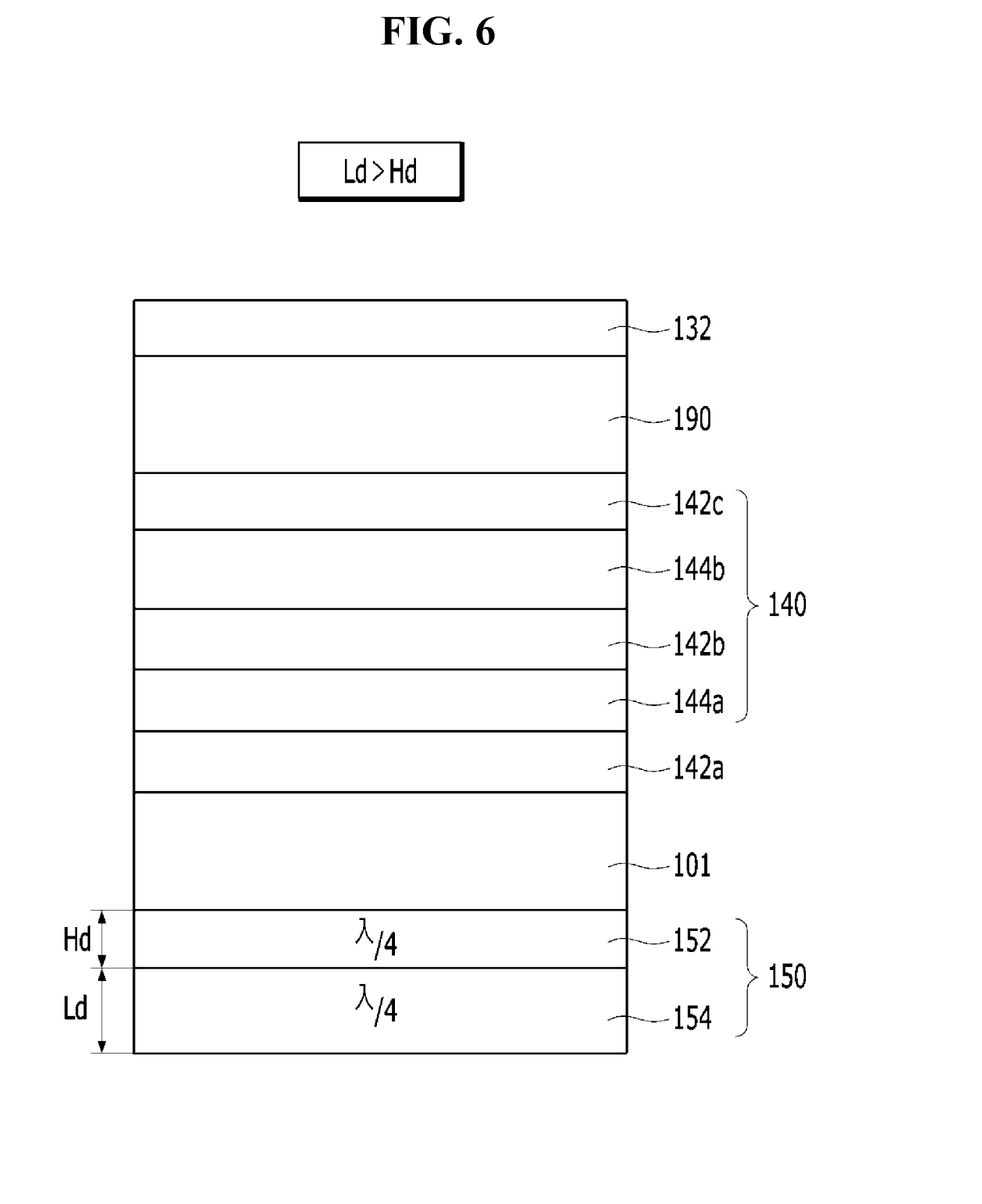
FIG. 6 is a cross-sectional view of an organic light-emitting display device according to an embodiment including a second light control layer structure.

FIG. 6 is a cross-sectional view of an organic light-emitting display device according to an embodiment including a second light control layer structure.

The organic light-emitting display device shown in FIG. 6 may have a substantially similar configuration as the organic light-emitting display device in accordance with the above-described examples, except that the organic light-emitting display device in accordance with this example further includes a second light control layer structure 150.

To reduce a refractive index difference between a substrate 101 and an air layer on the lower surface of the substrate 101 having different refractive indexes, the second light control layer structure 150 may be between the substrate 101 and the air layer, and may have a refractive index between the refractive indexes of the substrate 101 and the air layer. For example, if the substrate 101 has a refractive index of 1.5 and the air layer has a refractive index of 1, the second light control layer structure 150 may have a refractive index of 1-1.5.

As such, the second light control layer structure 150 may be formed by alternately stacking a lower high refractive index layer 152 and a lower low refractive index layer 154 at least one time on the lower surface of the substrate 101, as shown in the FIG. 6 example. Although this example describes the second light control layer structure 150 as including two layers, e.g., the lower high refractive index layer 152 and the lower low refractive index layer 154, the second light control layer structure 150 may include three or more layers, e.g., lower high refractive index layers 152 and lower low refractive index layers 154, which may be alternately stacked. For example, if the uppermost layer 152 of the second light control layer structure 150 contacting the lower surface of the substrate 101 has a high refractive index and the lowermost layer 154 of the second light control layer structure 150 contacting the air layer has a low refractive index, low reflection effects may be acquired.

The lower low refractive index layer 154 may be formed of a material having a refractive index n1 which may be greater than or equal to 1.3 and may be less than or equal to 1.6 (e.g., 1.3≤n1≤1.6). For example, the lower low refractive index layer 154 may have a single layer or multilayer structure using at least one of $SiO_2$ (n1=1.4-1.5) and $MgF_3$ (n1=1.3-1.4). The lower high refractive index layer 152 may be formed of a material having a refractive index n2 which may be greater than or equal to 1.6 and may be less than or equal to 2.4 (e.g., 1.6≤n2≤2.4). The lower high refractive index layer 152 may have a single layer or multilayer structure using at least one of $Si_3N_4$ (n2=1.8-1.9), $TiO_2$ ($n2$=2.0-2.3), MgO ($n2$=1.74), $Al_2O_3$ ($n2$=1.8-1.9), SiO ($n2$=1.8-1.9) and ZnS ($n2$=2.3-2.4).

The optical thicknesses of the respective layers of the second light control layer structure 150 may be $\lambda/4i$ (where "i" is a natural number). For example, the lower high refractive index layer 152 and the lower low refractive index layer 154 may have an optical thickness of $\lambda/4$. For example, when the wavelength of blue light generated by the first light-emitting layer 116 is 450 nm, the lower high refractive index layer 152 having an optical thickness of $\lambda/4$ may have a physical thickness Hd of 50-60 nm, and the lower low refractive index layer 154 having an optical thickness of $\lambda/4$ may have a physical thickness Ld of 65-80 nm. For example, an optical thickness $\lambda/4i$ is equal to a refractive index n multiplied by a physical thickness d. All numerical examples above are nonlimiting.

Therefore, because light reflected by the upper surface of each of the layers of the second light control layer structure 150, and light reflected by the lower surface of each of the layers of the second light control layer structure 150 may interfere with each other and may thus be offset, reflection of light at the interface between the substrate 101 and the air layer may be reduced or prevented. That is, by the second light control layer structure 150, light generated by the first and second light-emitting layers 116 and 126 may not be reflected at the interface between the substrate 101 and the air layer toward the cathode 136, and may be transmitted by the air layer, and luminous efficacy may thus be improved.

It may be confirmed from Table 1 below that organic light-emitting display devices including light control layer structures 140 and/or 150 in test examples have raised efficiencies and brightnesses of blue (B) light and yellowish-green (YG) light, as compared to an organic light-emitting display device of a comparative example that does not include a light control layer structure.

For example, in the organic light-emitting display device in test example 2, which includes the anode 132 including ITO and the light control layer structure 140, brightness of blue (B) light is increased by 18% and brightness of yellowish-green (YG) light is increased by 7%, as compared to the organic light-emitting display device in the comparative example. Further, in the organic light-emitting display device in test example 4, which includes the anode 132 including IZO and the light control layer structure 140, brightness of blue (B) light is increased by 25% and brightness of yellowish-green (YG) light is increased by 38%, as compared to the organic light-emitting display device in the comparative example. Further, in the organic light-emitting display devices in test examples 3 and 4, each of which includes the anode 132 including IZO and the light control layer structure 140, efficiency and brightness of yellowish-green (YG) light are further increased, as compared to the organic light-emitting display devices in test examples 1 and 2, each of which includes the anode 132 including ITO and the light control layer structure 140.

TABLE 1

|  | Brightness ($Cd/m^2$) | Efficiency (Cd/A) | CCT | Structure | Spectrum B | YG |
|---|---|---|---|---|---|---|
| Comparative example | 3113 | 77.8 | 7018 | Substrate/anode(ITO) | 1 | 1 |
| Test example 1 | 3341 | 83.52 | 5731 | Substrate/light control layer structure (10 layers)/anode (ITO) | 1% | 11% |
| Test example 2 | 3167 | 79.18 | 7055 | Substrate/light control layer structure (5 layers)/anode (ITO) | 18% | 7% |
| Test example 3 | 4083 | 102.1 | 4788 | Substrate/light control layer structure (10 layers)/anode (IZO) | 2% | 45% |
| Test example 4 | 3901 | 97.5 | 5911 | Substrate/light control layer structure (5 layers)/anode (IZO) | 25% | 38% |

Although two light-emitting stacks are used in the examples described herein, three or more light-emitting stacks may be used. As apparent from the above description, an organic light-emitting display device in accordance with an embodiment of the present disclosure may include a light control layer structure disposed between a substrate and an anode. By such a light control layer structure, light generated by first and second light-emitting layers may not be reflected at the interface between the anode and substrate toward a cathode, but may be transmitted by the substrate, and luminous efficacy may thus be improved.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. An organic light-emitting display device, comprising:
    a substrate;
    light-emitting elements on the substrate;
    a light control layer structure between an anode of each of the light-emitting elements and the substrate, the light control layer structure comprising at least one pair of an alternately stacked low refractive index layer and high refractive index layer, a lowest high refractive index layer contacting an upper surface of the substrate; and
    at least one thin film layer between the light control layer structure and the anode, the at least one thin film layer having a lower refractive index than the high refractive index layer.

2. The organic light-emitting display device of claim 1, wherein the light control layer structure has a refractive index between a refractive index of the anode and a refractive index of the substrate.

3. The organic light-emitting display device of claim 1, wherein the low refractive index layer has a greater thickness than a thickness of the high refractive index layer.

4. The organic light-emitting display device of claim 1, wherein the light control layer structure comprises, sequentially disposed on the substrate:
    a first high refractive index layer;
    a first low refractive index layer;
    a second high refractive index layer;

a second low refractive index layer; and a third high refractive index layer.

5. The organic light-emitting display device of claim 4, wherein the second low refractive index layer has a greater thickness than a thickness of at least one of the first to third high refractive index layers and a thickness of the first low refractive index layer.

6. The organic light-emitting display device of claim 1, wherein the light control layer structure comprises, sequentially disposed on the substrate:
 a first high refractive index layer;
 a first low refractive index layer;
 a second high refractive index layer;
 a second low refractive index layer;
 a third high refractive index layer;
 a third low refractive index layer;
 a fourth high refractive index layer;
 a fourth low refractive index layer;
 a fifth high refractive index layer; and
 a fifth low refractive index layer.

7. The organic light-emitting display device of claim 6, wherein at least one of the second and fourth low refractive index layers has a greater thickness than a thickness of at least one of the first to fifth high refractive index layers and a thickness of the first, third and fifth low refractive index layers.

8. An organic light-emitting display device, comprising:
 a substrate;
 light-emitting elements on the substrate;
 a light control layer structure between an anode of each of the light-emitting elements and the substrate, the light control layer structure comprising at least one pair of an alternately stacked low refractive index layer and high refractive index layer, a lowest high refractive index layer contacting an upper surface of the substrate; and
 a second light control layer structure on a lower surface of the substrate and comprising at least one pair of an alternately stacked lower low refractive index layer and lower high refractive index layer.

9. The organic light-emitting display device of claim 8, wherein a lowest lower high refractive index layer contacts the lower surface of the substrate.

10. The organic light-emitting display device of claim 8, wherein:
 the second light control layer structure is between the substrate and an air layer on the lower surface of the substrate; and
 the second light control layer structure has a refractive index between a refractive index of the substrate and a refractive index of the air layer.

11. The organic light-emitting display device of claim 8, wherein the lower low refractive index layer has a greater thickness than a thickness of the lower high refractive index layer.

12. The organic light-emitting display device of claim 1, wherein each of the light-emitting elements comprises:
 the anode;
 a cathode opposite the anode; and
 at least one light-emitting stack between the anode and the cathode,
 wherein the anode comprises a transparent conductive material, and
 wherein the cathode comprises a reflective conductive material.

13. The organic light-emitting display device of claim 12, wherein the at least one light-emitting stack comprises:
 a first light-emitting stack on the anode, the first light-emitting stack comprising a blue light-emitting layer; and
 a second light-emitting stack disposed between the first light-emitting stack and the cathode, the second light-emitting stack comprising a yellowish-green light-emitting layer.

14. The organic light-emitting display device of claim 1, wherein the at least one thin film layer has a same refractive index as the low refractive index layer.

15. The organic light-emitting display device of claim 1, further comprising:
 a thin film transistor connected to each of the light-emitting elements;
 a buffer film between an active layer of the thin film transistor and the light control layer structure;
 an interlayer insulating film between a gate electrode and a drain electrode of the thin film transistor;
 a protective film on the thin film transistor; and
 a planarization film between the protective film and the anode,
 wherein the at least one thin film layer comprises at least one of: the buffer film, the interlayer insulating film, the protective film, and the planarization film.

* * * * *